United States Patent
Ji et al.

(10) Patent No.: US 12,281,130 B2
(45) Date of Patent: Apr. 22, 2025

(54) ORGANOMETALLIC PRECURSOR COMPOUND

(71) Applicant: EGTM Co., Ltd., Gyeonggi-do (KR)

(72) Inventors: Sung Jun Ji, Gyeonggi-do (KR); Sun Young Baik, Gyeonggi-do (KR); Tae Young Lee, Gyeonggi-do (KR)

(73) Assignee: EGTM Co., Ltd. (KR)

( * ) Notice: Subject to any disclaimer, the term of this patent is extended or adjusted under 35 U.S.C. 154(b) by 578 days.

(21) Appl. No.: 17/532,612

(22) Filed: Nov. 22, 2021

(65) Prior Publication Data

US 2022/0194967 A1    Jun. 23, 2022

(30) Foreign Application Priority Data

Dec. 17, 2020  (KR) .................. 10-2020-0177372

(51) Int. Cl.
| | | |
|---|---|---|
| C07F 7/00 | (2006.01) | |
| C23C 16/02 | (2006.01) | |
| C23C 16/455 | (2006.01) | |

(52) U.S. Cl.
CPC ............ *C07F 7/00* (2013.01); *C23C 16/0218* (2013.01); *C23C 16/45534* (2013.01); *C23C 16/45553* (2013.01)

(58) Field of Classification Search
CPC .... C07F 7/00; C07F 17/00; C07F 7/28; C23C 16/0218; C23C 16/45534; C23C 16/45553; C23C 16/34; C23C 16/405; C23C 16/4486; C23C 16/18; C23C 16/303

See application file for complete search history.

(56) References Cited

U.S. PATENT DOCUMENTS

| | | |
|---|---|---|
| 2009/0081385 A1 | 3/2009 | Heys et al. |
| 2018/0162882 A1 | 6/2018 | Han et al. |

FOREIGN PATENT DOCUMENTS

| | | | |
|---|---|---|---|
| CN | 101815807 | | 8/2010 |
| CN | 111683953 A | | 9/2020 |
| JP | H08311120 A | | 11/1996 |
| JP | 2003048912 A | | 2/2003 |
| JP | 2004306014 A | * | 11/2004 |
| JP | 2006045083 A | | 2/2006 |
| JP | 2012009823 A | | 1/2012 |
| JP | 2013047391 A | | 3/2013 |
| JP | 2016037654 A | | 3/2016 |
| KR | 20080101040 A | | 11/2008 |
| WO | 2003029256 A1 | | 4/2003 |

OTHER PUBLICATIONS

Machine translation, JP-2004-306014 (Year: 2004).*
JPO Office Action for Japanese Patent Application No. 2021-183735 dated Nov. 21, 2022.
KIPO Office Action for KR Patent Application No. 10-2020-0177372 dated 2023-01-25.
Chinese Office Action for CN Patent Application No. 202111534057.6 dated Sep. 27, 2023. English Machine Translation with Original Untranslated Version, PDF file. 14 pages.
IP.com. Group 4 Transition Metal-Containing Compounds for Vapor Deposition of Group 4 Transition Metalcontaining Films. An IP.com Prior Art Database Technical Disclosure, 2017. IPCOM000250283D. PDF file, 18 pages.

* cited by examiner

*Primary Examiner* — Michael G Miller
(74) *Attorney, Agent, or Firm* — C. Tumey Law Group PLLC (57) ABSTRACT

The present specification provides an organic group 4 metal precursor compound and a method for forming a thin film using the same.

3 Claims, 4 Drawing Sheets

ORGANOMETALLIC PRECURSOR COMPOUND

CROSS-REFERENCE TO RELATED APPLICATIONS

This application claims the priority of Korean Patent Application No. 10-2020-0177372 filed on Dec. 17, 2020 in the Korean Intellectual Property Office, the disclosure of which is incorporated herein by reference.

BACKGROUND

Field

The present disclosure relates to an organometallic precursor compound and a method for manufacturing a thin film using the same.

Description of the Related Art

A thin film may mean a thin film having a thickness that is impossible to realize by machining, and the formation of such a thin film is a process of imparting desired electrical properties to a semiconductor, and thus may be the most important in a semiconductor process. Furthermore, the formation of a semiconductor thin film may be largely divided into chemical vapor deposition (CVD), which forms an insulating film (or a metal film), etc. by a chemical method, and physical vapor deposition (PVD), which forms a metal film by a physical method. In addition, it may include spin on glass (SOG) which forms the film by spraying a solution to form an oxide film using oxygen on the surface of a wafer and rotating the wafer, a damascene method which electrically forms a copper film by decomposing the solution, and atomic layer deposition (ALD) in which particles formed by a chemical reaction between reaction gases containing reaction raw materials are deposited on the surface of a substrate.

Meanwhile, an atomic layer deposition (ALD) technique, which overcomes disadvantages of the aforementioned CVD and PVD and is capable of satisfying a thinner film thickness and reliability at the same time, has recently been attracting attention.

More specifically, thin films such as films containing zirconium, hafnium, etc. in the manufacture of semiconductor devices may be generally formed using a metal organic chemical vapor deposition (MOCVD) or atomic layer deposition (ALD) process. According to the development of semiconductor manufacturing technology, very thin and uniform thin films are required, and the importance of the atomic layer deposition process capable of adjusting up to the atomic unit of the thin films has been increasing accordingly. Furthermore, as ALD is an adsorption method, there is not only almost no step coverage, which is a weakness of PVD, but also voids to be formed inside the film or pinholes perforated to extremely small diameters in the surface hardly appear. Moreover, ALD has advantages in that the entire film has a homogeneous lattice composition (matched deposition capability) and can be coated to a constant thickness of the nano unit so that it may be a more improved method than the conventional deposition method.

In order to deposit a high-quality thin film through such an atomic layer deposition process, it is very important to select a suitable precursor. The precursor affects physical and electrical properties of the thin film. A precursor suitable for the atomic layer deposition process which forms a thin film should have a low viscosity and a high vapor pressure, have suitable reactivity, and be thermally stable.

For example, organic group 4 precursor compounds currently used in the atomic layer deposition process to form high-dielectric constant thin films include tris(dimethylamino)cyclopentadienyl zirconium(IV)[CpZr(NMe$_2$)$_3$](so-called ZAC) which is a zirconium precursor compound and tris(dimethylamino)cyclopentadienyl hafnium(IV)[CpHf(NMe$_2$)$_3$] (so-called HAC) which is a hafnium precursor compound.

Although, since such precursors are in a liquid state at room temperature, they are suitable for process application and have the advantage of excellent reactivity with additional reactants in the process of forming an oxide film, when storing, they are easy to self-decompose and are thermally unstable so that there are limits in manufacturing good-quality thin films. Accordingly, there is a need for a precursor which has homogeneous applicability and can solve a problem that impurities are remained within the thin films.

The description which becomes the background of the disclosure has been prepared to further facilitate understanding of the present disclosure. It should not be understood as an admission that the matters described in the description which becomes the background of the disclosure exist as prior art.

SUMMARY

Meanwhile, inventors of the present disclosure have paid attention to a complex compound structure composed of three types of ligands. At this time, it has been recognized that, when one of the ligands of a conventional compound is substituted, the viscosity of the compound may be lowered as the strength of each attraction is weakened.

Eventually, the inventors of the present disclosure have found that, when one of amine ligands of a conventional hafnium compound is substituted with an alkoxy ligand, it has stability as a compound and may lower the viscosity. Moreover, it has been found that the hafnium compound having a substituted structure as described above has improved thermal stability as the alkoxy ligand is a ligand with a stronger binding force.

Accordingly, the problem to be solved by the present disclosure is to provide an organometallic precursor compound which has stability and may form a thinner thin film as it has a heteroleptic structure different from the conventional hafnium compound.

Problems of the present disclosure are not limited to the problems mentioned above, and other problems that have not been mentioned will be clearly understood by those skilled in the art from the following description.

In order to solve the problems as described above, the present disclosure provides an organometallic precursor compound represented by the following Chemical Formula 1:

[Chemical Formula 1]

at this time, in Chemical Formula 1 above, $R_1$, $R_2$, $R_3$, $R_4$, and $R_5$ are each independently selected from hydrogen, an alkyl group having 1 to 5 carbon atoms, an alkoxy group having 1 to 5 carbon atoms, and a phenyl group having 6 to 12 carbon atoms,

M is selected from metal elements belonging to group 4 on the Periodic Table, $R_6$, $R_7$, and $R_8$ are each independently selected from hydrogen, a linear alkyl group having 1 to 5 carbon atoms, and a branched alkyl group having 3 to 5 carbon atoms, $X_1$ is each independently selected from organic groups represented by the following Chemical Formula 2a or 2b:

[Chemical Formula 2a]

[Chemical Formula 2b]

in Chemical Formulas 2a and 2b above, $R_9$, $R_{10}$, and $R_{11}$ may each independently be selected from the group consisting of hydrogen, a linear alkyl group having 1 to 5 carbon atoms, and a branched alkyl group having 3 to 5 carbon atoms.

According to a feature of the present disclosure, although M in Chemical Formula 1 above may be selected from the group consisting of Ti, Zr, Hf, and Rf, the present disclosure is not limited thereto.

According to another feature of the present disclosure, the organometallic precursor compound may be an organometallic precursor compound represented by the following Chemical Formula 3:

[Chemical Formula 3]

at this time, in Chemical Formula 3 above, $R_1$, $R_2$, $R_3$, $R_4$, $R_5$, $R_6$, and $R_7$ may be each independently selected from hydrogen and an alkyl group having 1 to 5 carbon atoms.

Furthermore, the present disclosure provides a method for manufacturing a thin film, the method including introducing the aforementioned organometallic precursor compound of Chemical Formula 1 or Chemical Formula 3 into a reactor in order to solve the problems as described above.

According to a feature of the present disclosure, although the method for manufacturing a thin film may be atomic layer deposition or chemical vapor deposition, the present disclosure is not limited thereto, and the method may include all of various methods capable of forming the thin film on a substrate.

According to another feature of the present disclosure, the method for manufacturing a thin film may further comprise introducing at least one of an oxidizing agent, a nitrifying agent, and a reducing agent.

According to another feature of the present disclosure, the thin film may be a bis(dimethylamino)(iso-propoxy)(methylcyclopentadienyl)hafnium oxide ($HfO_x$) film, and such a bis(dimethylamino)(iso-propoxy)(methylcyclopentadienyl) hafnium oxide ($HfO_x$) film may have a growth per cycle (GPC) value of a level that is lower by about 0.2 than that of a (cyclopentadienyl)tris(dimethylamino)hafnium oxide film.

According to another feature of the present disclosure, the method for manufacturing a thin film further comprises transferring the precursor compound onto the substrate. At this time, although the transferring process may be performed by at least one of a volatilization transfer method using vapor pressure, a direct liquid injection method, and a liquid transfer method (liquid delivery system), the present disclosure is not limited thereto. All of the various methods in which an organometallic precursor compound according to an embodiment of the present disclosure can be transferred onto the substrate may be included.

Hereinafter, the present disclosure will be described in more detail through embodiments. However, since these embodiments are only for exemplarily explaining the present disclosure, the scope of the present disclosure should not be construed as being limited by these embodiments.

As the present disclosure is a complex compound consisting of three types of ligands (heteroleptic ligands), in which one of three amine ligands is substituted with an alkoxy ligand, it may have a lower viscosity than tris(dimethylamino)cyclopentadienyl hafnium(IV) [$CpHRNMe_2)_3$] (so-called HAC) which is a conventional representative organic group 4 metal precursor compound, and can be supplied more smoothly within deposition equipment accordingly.

Furthermore, the present disclosure has effects of increasing thermal stability and reducing residues after decomposition as it has been substituted with a ligand with stronger binding force.

Therefore, the present disclosure may deposit the thin film more efficiently in the process of depositing a thin film on a substrate, and the quality of a formed thin film may be superior to that of a conventional thin film accordingly.

The effects according to the present disclosure are not limited by the contents exemplified above, and more various effects are included in the present specification.

DETAILED DESCRIPTION OF THE EMBODIMENT

Advantages and features of the present disclosure and methods of achieving them will become apparent with reference to embodiments to be described later in detail along with the accompanying drawings. However, the present disclosure is not limited to the embodiments disclosed below, but will be implemented in a variety of forms that are different from each other. The present embodiments only allow the disclosure of the present disclosure to be complete, and are provided to fully inform those skilled in the art to which the present disclosure pertains of the scope of the disclosure, and the present disclosure is only defined by the scope of the claims.

The same reference numerals refer to the same elements throughout the specification.

Since the shapes, sizes, proportions, angles, numbers, etc. disclosed in the drawings for explaining the embodiments of the present disclosure are exemplary, the present disclosure is not limited to the illustrated matters. Further, in the description of the present disclosure, if it is determined that detailed descriptions of related disclosed art may unnecessarily obscure the gist of the present disclosure, the detailed descriptions thereof will be omitted. When 'include', 'have', 'consist of', etc. mentioned in the present specification are used, other parts may be added unless 'only' is used. When an element is expressed in the singular number, the case in which the plural number is included is included unless otherwise explicitly stated.

In interpreting the elements, it is interpreted as including an error range even if there is no separate explicit description.

The respective features of various embodiments of the present disclosure may be partially or wholly joined or combined with each other, and as those skilled in the art will be able to fully understand, technically various interlocking and driving are possible, and it may be possible to independently implement the respective embodiments with respect to each other, and it may also be possible to implement the respective embodiments together in an associative relationship.

For clarity of interpretation of the present specification, terms used in the present specification will be defined below.

The terms used in the specification, expressions such as "on" and "above", may mean that they are used to refer to a relative position concept. Therefore, not only there is the case where another element or layer is directly present in a mentioned layer, but also there is the case where another layer (intermediate layer) and another element may be interposed or present therebetween.

The term used in the present specification "about" is used as a meaning in or close to a numerical value thereof when manufacturing and material tolerances inherent in the mentioned meaning are presented, and it is used to prevent an unscrupulous infringer from unfairly using a disclosure in which exact or absolute numerical values are mentioned in order to help understanding of the present specification. Further, throughout the present specification, "a step to" or "a step of" does not mean "a step for".

Organometallic Precursor Compound According to Embodiment of Present Disclosure and Method for Manufacturing Thin Film Using Same Hereinafter, an organometallic precursor compound according to an embodiment of the present disclosure and a method for manufacturing a thin film using the same will be described with reference to FIG. 1.

An organometallic precursor compound according to an embodiment of the present disclosure may provide an organometallic precursor compound represented by the following Chemical Formula 1:

[Chemical Formula 1]

in Chemical Formula 1 above, although $R_1$, $R_2$, $R_3$, $R_4$, and $R_5$ may each independently be selected from the group consisting of hydrogen, an alkyl group having 1 to 5 carbon atoms, an alkoxy group having 1 to 5 carbon atoms, and a phenyl group having 6 to 12 carbon atoms, the present disclosure is not limited thereto.

Although M may be selected from metal elements belonging to group 4 on the Periodic Table, the present disclosure is not limited thereto, and M may include all of the various metal elements.

Although $R_6$, $R_7$, and $R_8$ may each independently be selected from the group consisting of hydrogen, a linear alkyl group having 1 to 5 carbon atoms, and a branched alkyl group having 3 to 5 carbon atoms, the present disclosure is not limited thereto.

$X_1$ is each independently selected from organic groups represented by the following Chemical Formula 2a or 2b:

[Chemical Formula 2a]

[Chemical Formula 2b]

in Chemical Formulas 2a and 2b above, although $R_9$, $R_{10}$, and $R_{11}$ may each independently be selected from the group consisting of hydrogen, a linear alkyl group having 1 to 5 carbon atoms, and a branched alkyl group having 3 to 5 carbon atoms, the present disclosure is not limited thereto.

Meanwhile, although an organometallic precursor compound according to an embodiment of the present disclosure may be an organometallic precursor compound represented by Chemical Formula 1 as described above, it may preferably be an organometallic precursor compound represented by the following Chemical Formula 3:

[Chemical Formula 3]

in Chemical Formula 3 above, although $R_1$, $R_2$, $R_3$, $R_4$, $R_5$, $R_6$, and $R_7$ may each independently be selected from the group consisting of hydrogen and an alkyl group having 1 to 5 carbon atoms, the present disclosure is not limited thereto.

Meanwhile, an organometallic precursor compound according to an embodiment of the present disclosure may include at least one group 4 metal of Ti, Zr, Hf, and Rf, and may include hafnium (Hf) which is the most preferred form as a metal precursor. That is, an organometallic precursor compound according to an embodiment of the present disclosure may be bis(dimethylamino)(iso-propoxy)(methylcyclopentadienyl)hafnium of Chemical Formula 3 above.

Again, although the organometallic precursor compound of Chemical Formula 1 above may be a solid or liquid at room temperature, it may preferably be a liquid. Further, it has high volatility and thermal stability, high reactivity along with various oxidizing agents, and a wide process temperature range (ALD window w) during the ALD process.

Such an organometallic precursor compound of Chemical Formula 1 above may be used for a method for manufacturing a thin film, although the method for manufacturing the thin film may be an atomic layer deposition method or a chemical vapor deposition method, the present disclosure is not limited thereto, and it may include all of a variety of methods capable of depositing the organometallic precursor compound of Chemical Formula 1 above on the substrate.

At this time, the chemical vapor deposition method is a technique for forming a desired thin film on the surface of a substrate by injecting a reactive gas into a reactor, thereby applying appropriate active and reactive energy. During the process, it has an advantage of low costs by enabling mass production, enables various kinds of elements and compounds to be deposited, has a very wide control range of the process conditions so that thin films with various characteristics may be easily obtained, and enables excellent step coverage to be obtained.

Furthermore, the atomic layer deposition method is a technique for forming a thin film by a self-limiting reaction by alternately supplying elements necessary for the formation of the thin film. The atomic layer deposition method enables a very thin film to be deposited, and enables desired thickness and composition to be precisely controlled. It not only can form a film of uniform thickness even on a large-area substrate, and exhibits excellent step coverage even at a high aspect ratio. Further, it has an advantage that there are fewer impurities in the thin film.

Figure 1:
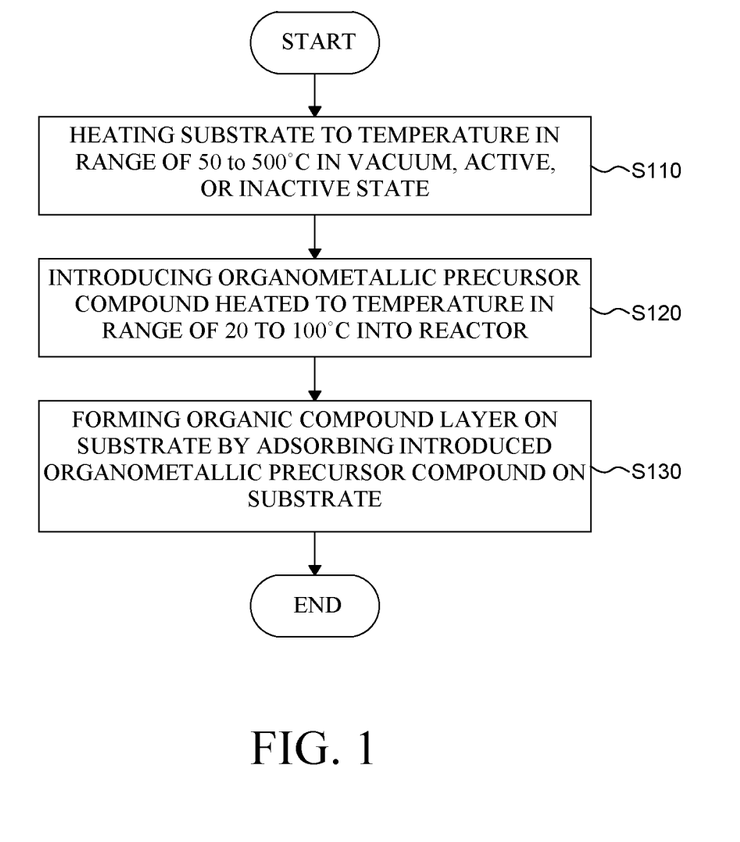
FIG. 1 is a flowchart of a method for manufacturing a thin film using an organometallic precursor compound according to an embodiment of the present disclosure.

More specifically, referring to FIG. 1, the atomic layer deposition method, which is a method for manufacturing a thin film according to an embodiment of the present disclosure, may comprise a step S110 of heating a substrate to a temperature of 50 to 500° C. in a vacuum, active, or inactive state and a step S120 of introducing an organometallic precursor compound heated to a temperature of 20 to 100° C. into a reactor; and a step S130 of forming an organic compound layer on the substrate by adsorbing the introduced organometallic precursor compound on the substrate. At this time, in the step of forming the organic compound layer on the substrate, a thin film may be formed on the organic compound layer, that is, the substrate by applying thermal energy, plasma, or electrical bias to the substrate, thereby decomposing the organic compound.

Eventually, an organometallic precursor compound according to an embodiment of the present disclosure may be used in the step (S120) of introducing the organometallic precursor compound into the reactor in the above-described method for manufacturing a thin film.

Furthermore, the above-described method for manufacturing the thin film, that is, the atomic layer deposition method may further comprise transferring an organometallic precursor compound onto a substrate. At this time, although the supply method may be at least one of a volatilization transfer method using vapor pressure, a direct liquid injection method, and a liquid transfer method (liquid delivery system), the present disclosure is not limited thereto. It may include all of the various methods capable of transferring an organometallic precursor compound according to an embodiment of the present disclosure onto the substrate.

Further, a deposition process may be performed by mixing an organometallic precursor compound according to an embodiment of the present disclosure with at least one reaction gas of water vapor ($H_2O$), oxygen ($O_2$), and ozone ($O_3$) and transferring a mixture of the organometallic precursor compound and the at least one reaction gas onto a substrate, or by transferring the reaction gas onto the substrate separately from the organometallic precursor compound according to an embodiment of the present disclosure.

Further, the deposition process may be performed by mixing an organometallic precursor compound according to an embodiment of the present disclosure with at least one reaction gas of ammonia ($NH_3$), hydrazine ($N_2H_4$), nitrogen dioxide ($NO_2$), and nitrogen (Na) plasma and transferring a mixture of the organometallic precursor compound and the at least one reaction gas onto the substrate, or by transferring the reaction gas onto the substrate separately from the organometallic precursor compound according to an embodiment of the present disclosure.

That is, in a method for manufacturing a thin film using an organometallic precursor compound according to an embodiment of the present disclosure, the organometallic precursor compound may be mixed with a reaction gas containing oxygen and nitrogen as described above, that is, an oxidizing agent or a nitrifying agent, so that a mixture of the organometallic precursor compound and the reaction gas may be transferred onto the substrate. More specifically, the oxidizing agent may refer to an activated oxidizing agent capable of generating oxygen (O) radicals as well as an oxidizing agent containing a hydroxyl group. For example, the activated oxidizing agent may include ozone ($O_3$), plasma $O_2$, remote plasma $O_2$, and plasma $N_2O$ which are formed by a plasma generator, and when oxygen gas is treated to form ozone, a portion of the $O_2$ gas is converted to $O_3$ to generate a mixed gas of $O_2/O_3$ having a molar ratio of about 5 to 15%. In addition, the oxidizing agent may contain a hydroxyl group such as $H_2O$ or $H_2O_2$, and other compounds containing oxygen such as $N_2O$ or $NO_2$.

Accordingly, an organometallic precursor compound according to an embodiment of the present disclosure may form an atomic film of at least one of metal, metal oxide, and metal nitride on the substrate by reacting with at least one of the above-described oxidizing agent, nitrifying agent, and reducing agent.

For example, as an organometallic precursor compound according to an embodiment of the present disclosure containing a group 4 metal is reacted with an oxidizing agent, although the thin film formed on the substrate in a method for manufacturing a thin film using an organometallic precursor compound according to an embodiment of the present disclosure may be a zirconium oxide ($ZrO_x$) film or a hafnium oxide ($HfO_x$) film of the atomic layer unit, it may be preferably the hafnium oxide ($HfO_x$) film.

Further, the thin film formed on the substrate in a method for manufacturing a thin film using an organometallic precursor compound according to an embodiment of the present disclosure may be a zirconium nitride ($ZrN_x$) film or a hafnium nitride ($HfN_x$) film of the atomic layer unit.

Meanwhile, a method for manufacturing a thin film using an organometallic precursor compound according to an embodiment of the present disclosure is capable of removing an organometallic precursor compound and an oxidizing agent which have not been adsorbed onto the substrate by introducing at least one carrier gas or dilution gas of argon (Ar), nitrogen ($N_2$), helium (He), and hydrogen ($H_2$).

Accordingly, the method for manufacturing a thin film using an organometallic precursor compound according to an embodiment of the present disclosure may comprise removing unreacted organometallic precursor compound and oxidizing agent by introducing at least one carrier gas or dilution gas of argon (Ar), nitrogen ($N_2$), helium (He), and hydrogen ($H_2$) into a reactor, and the unreacted organometallic precursor compound may mean a precursor molecule that is not adsorbed onto the substrate.

Through the above processes, an organometallic precursor compound according to an embodiment of the present disclosure may be used in a method for manufacturing a thin film, that is, the atomic layer deposition method.

Verifying Characteristics of Organometallic Precursor Compound According to Embodiment of the Present Disclosure Hereinafter, characteristics of an organometallic precursor compound according to an embodiment of the present disclosure will be described with reference to FIGS. 2 to 4.

First, an organometallic precursor compound according to an embodiment of the present disclosure may be bis(dimethylamino)(iso-propoxy)(methylcyclopentadienyl)hafnium represented by the following Chemical Formula 3:

[Chemical Formula 3]

in Chemical Formula 3 above, although $R_1$, $R_2$, $R_3$, $R_4$, $R_5$, $R_6$, and $R_7$ may each independently be selected from the group consisting of hydrogen and an alkyl group having 1 to 5 carbon atoms, the present disclosure is not limited thereto.

Furthermore, bis(dimethylamino)(iso-propoxy)(methylcyclopentadienyl)hafnium represented by Chemical Formula 3 above may be obtained by the process below.

First, in order to obtain bis(dimethylamino)(iso-propoxy)(methylcyclopentadienyl)hafnium represented by Chemical Formula 3 above, after putting 200 ml of hexane and 153.6 ml of n-butyllithium 2.5 M into a 1000 mL Schlenk flask that has been flame dried in an anhydrous and inert state, they are stirred at −30° C. to obtain a mixed solution (the concentration of butyllithium in the mixed solution is 0.0384 mol). Next, after obtaining a reaction solution by slowly adding 17.73 g (0.393 mol) of dimethylamine to the mixed solution while maintaining a low temperature, temperature of the reaction solution is slowly increased to −10° C. Next, after stirring a reaction solution having dimethylamine mixed therein for 5 hours to obtain a stirred solution, the stirred solution is cooled to −30° C. again, and 30 g (0.093 mol) of hafnium chloride is slowly added to the cooled stirred solution to obtain a mixed solution. Next, after slowly increasing temperature of the mixed solution to room temperature and stirring the mixed solution for 12 hours, a reaction is finished to obtain a reaction-finished reaction mixture. Next, after filtering the reaction-finished reaction mixture and removing a produced white solid to obtain a filtrate, the filtrate is cooled to −30° C. Next, after slowly increasing temperature of the cooled filtrate to room temperature, slowly adding 7.65 g (0.095 mol) of methylcyclopentadiene to the filtrate, and stirring methylcyclopentadiene in the filtrate for 12 hours, a reaction is finished to obtain a reaction-finished reaction mixture solution. Next, after cooling the reaction-finished reaction mixture solution to −30° C., 5.59 g (0.093 mol) of isopropyl alcohol is slowly added to the cooled reaction mixture solution to obtain a reaction-finished reaction mixture. Next, after removing a solvent from the reaction-finished reaction mixture under reduced pressure, 9.71 g (0.048 mol) of bis(dimethylamino)(iso-propoxy)(methylcyclopentadienyl)hafnium represented by Chemical Formula 3 above is obtained at a yield of 52% through distillation.

Figure 2:
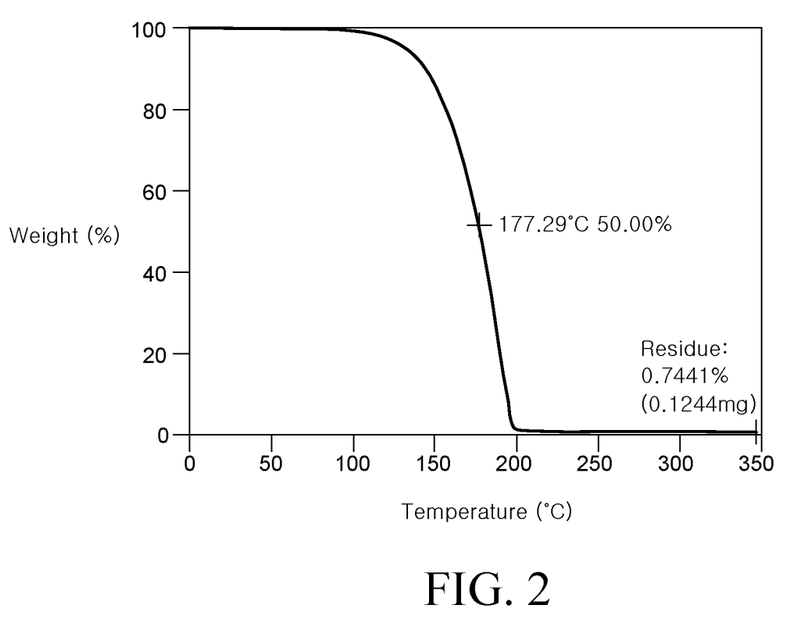
FIG. 2 shows a result of a thermogravimetric analysis (TGA) test of an organometallic precursor compound according to an embodiment of the present disclosure.

Accordingly, referring to FIG. 2, a result of a thermogravimetric analysis (TGA) test of an organometallic precursor compound according to an embodiment of the present disclosure is shown. At this time, the TGA test is performed with a thermal analyzer in a thermogravimetric analysis mode in order to measure the residual component amount, and the result is shown in Table 1.

TABLE 1

| Organometallic precursor compound | T(1/2) (° C.) | Residue (%) |
|---|---|---|
| Compound of Chemical Formula 3 | 177.29 | 0.74 |

More specifically, an organometallic precursor compound according to an embodiment of the present disclosure, that is, a compound represented by Chemical Formula 3 is shown to have a residual amount of 50% at 177.29° C., and have 0.74% with almost no residual amount at 300° C. or more, i.e., 350° C. That is, an organometallic precursor compound according to an embodiment of the present disclosure may have thermal stability without being decomposed upon vaporization.

Figure 3:
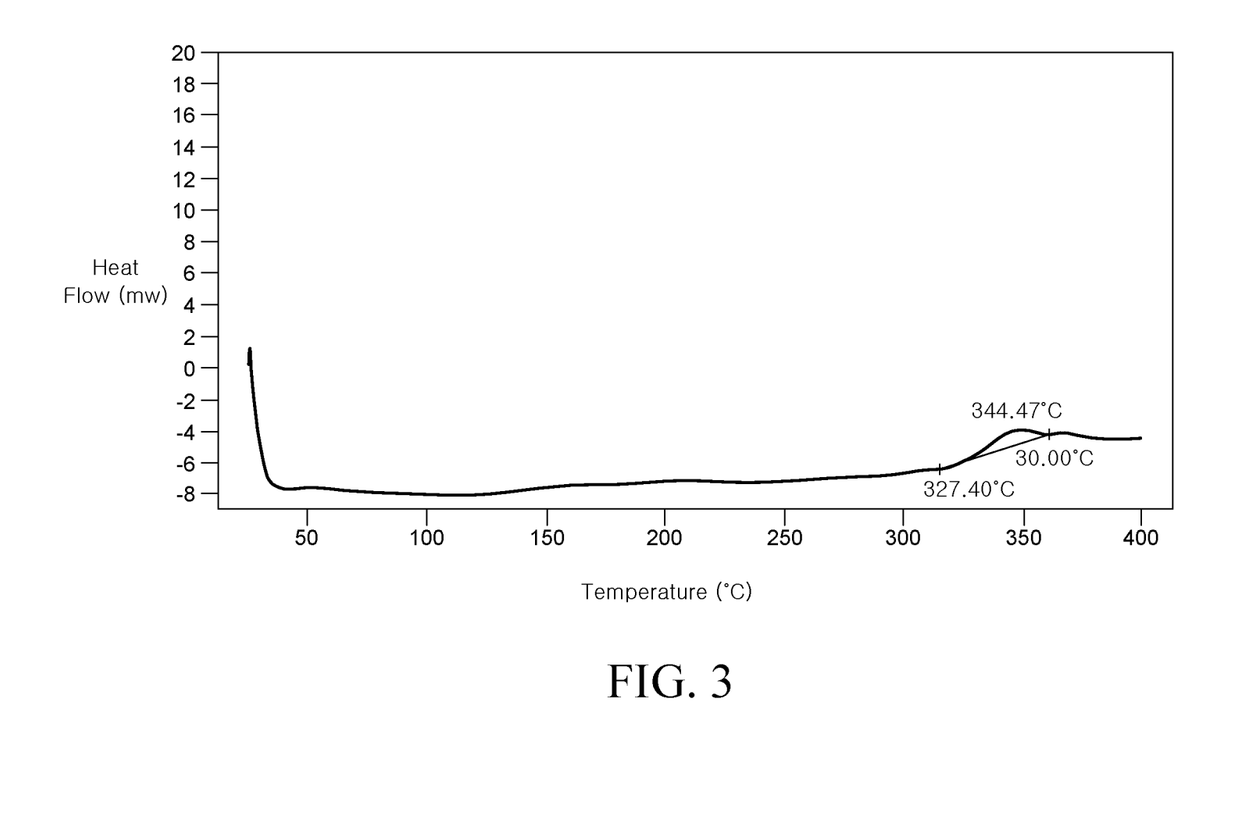
FIG. 3 shows a result of a differential scanning calorimetry (DSC) test of an organometallic precursor compound according to an embodiment of the present disclosure.

Referring to FIG. 3, a result of a differential scanning calorimetry (DSC) test of an organometallic precursor compound according to an embodiment of the present disclosure is shown. At this time, the DSC test is performed with a thermal analyzer in a differential scanning calorimetry mode in order to measure the thermal decomposition temperature, and the result is shown in Table 2.

TABLE 2

| Organometallic precursor compound | Td (° C.) | Viscosity (cP) |
|---|---|---|
| Compound of Chemical Formula 3 | 344.47 | 5.74 |

More specifically, an organometallic precursor compound according to an embodiment of the present disclosure, that is, a compound represented by Chemical Formula 3 is shown to be decomposed at 344.47° C.

Further, as shown in Table 2, an organometallic precursor compound according to an embodiment of the present disclosure, that is, a compound represented by Chemical Formula 3 is shown to have a viscosity of 5.74 cP. That is, the organometallic precursor compound according to an embodiment of the present disclosure, that is, the compound represented by Chemical Formula 3 has a viscosity lower than that of the conventional hafnium compound, that is, 9.51 cP, so that it can be supplied more smoothly within the deposition equipment.

According to the above results, an organometallic precursor compound according to an embodiment of the present disclosure may have a superior deposition effect than the conventional compound in the process of forming a thin film.

Figure 4:
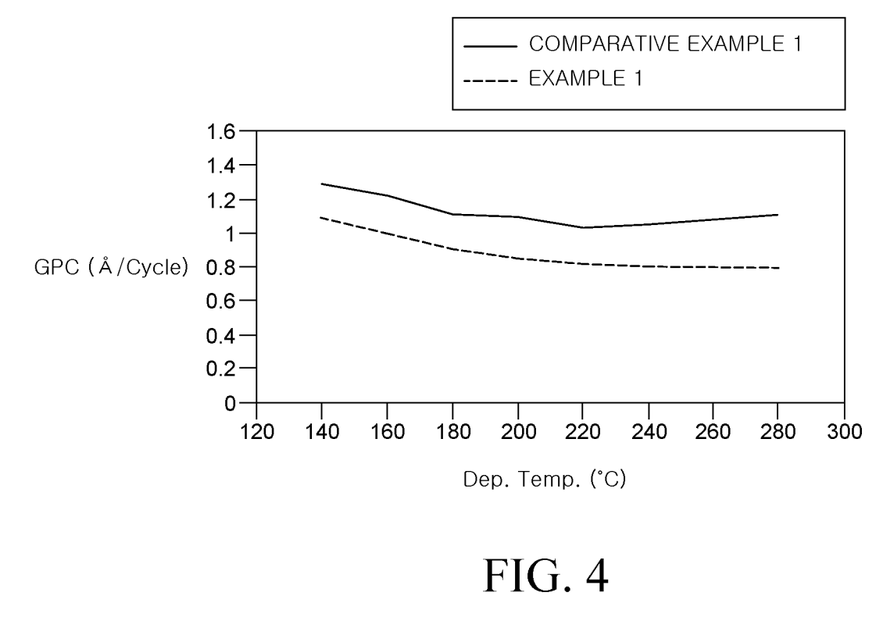
FIG. 4 shows results of observing changes in thin film deposition characteristics according to the deposition temperature of an organometallic precursor compound according to an embodiment of the present disclosure.

More specifically, referring to FIG. 4, results of observing changes in thin film deposition characteristics according to the deposition temperature of an organometallic precursor compound according to an embodiment of the present disclosure are shown. At this time, (cyclopentadienyl)tris(dimethylamino)hafnium is used as Comparative Example. Furthermore, in order to observe the changes in the thin film deposition characteristics according to the deposition temperature, ozone is used as an oxidizing agent, and the injection time (precursor feeding 17 seconds) of the organometallic precursor compound is fixed by a liquid transfer method (liquid delivery system type, vaporizer temperature: 150° C.) at room temperature, and then the deposition characteristics are evaluated while changing the deposition temperature from 140 to 280° C.

Although an organometallic precursor compound according to an embodiment of the present disclosure (Example 1) is shown to have an ALD window section (200 to 280° C.) similar to Comparative Example 1, it is shown to have a growth per cycle (GPC) value that is lower by about 0.2 than Comparative Example 1.

Accordingly, as an organometallic precursor compound according to an embodiment of the present disclosure has improved step coverage on the substrate, the deposition rate is increased, and the pattern loading rate effect is decreased so that finer thin film thickness control may be possible.

According to the above results, an organometallic precursor compound according to an embodiment of the present disclosure may provide more improved stability and reliability in the formation of various thin films including the semiconductor process.

Although the exemplary embodiments of the present disclosure have been described in more detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organometallic precursor compound represented by the following Chemical Formula 1:

[Chemical Formula 1]

in Chemical Formula 1 above,
$R_1$, $R_2$, $R_3$, $R_4$, and $R_5$ are each independently selected from the group consisting of hydrogen, an alkyl group having 1 to 5 carbon atoms, and an alkoxy group having 1 to 5 carbon atoms,
M is selected from metal elements belonging to group 4 on the Periodic Table,
$R_6$, $R_7$, and $R_8$ are each independently selected from the group consisting of hydrogen, a linear alkyl group having 1 to 5 carbon atoms, and a branched alkyl group having 3 to 5 carbon atoms,
$X_1$ is each independently selected from organic groups represented by the following Chemical Formula 2a or 2b:

[Chemical Formula 2a]

[Chemical Formula 2b]

A.
in Chemical Formulas 2a and 2b above,
B. $R_9$, $R_{10}$, and $R_{11}$ are each independently selected from the group consisting of hydrogen, a linear alkyl group having 1 to 5 carbon atoms, and a branched alkyl group having 3 to 5 carbon atoms.

2. The organometallic precursor compound of claim 1, wherein M in Chemical Formula 1 above is selected from the group consisting of Ti, Zr, Hf, and Rf.

3. The organometallic precursor compound of claim 1, wherein the organometallic precursor compound is represented by the following Chemical Formula 3:

[Chemical Formula 3]

in Chemical Formula 3 above,
$R_1$, $R_2$, $R_3$, $R_4$, $R_5$, $R_6$, and $R_7$ are each independently selected from the group consisting of hydrogen and an alkyl group having 1 to 5 carbon atoms.

* * * * *